United States Patent [19]

Gotou

[11] Patent Number: 5,372,964
[45] Date of Patent: Dec. 13, 1994

[54] METHOD OF PRODUCING PILLAR-SHAPED DRAM AND ROM DEVICES

[75] Inventor: Hiroshi Gotou, Niiza, Japan

[73] Assignee: Fujitsu Limited, Kawasaki, Japan

[21] Appl. No.: 72,876

[22] Filed: Jun. 4, 1993

Related U.S. Application Data

[60] Continuation of Ser. No. 723,173, Jun. 28, 1991, abandoned, which is a division of Ser. No. 357,809, May 30, 1989, Pat. No. 5,057,896.

[30] Foreign Application Priority Data

May 28, 1988 [JP] Japan .................. 63-129463

[51] Int. Cl.⁵ ............... H01L 21/70; H01L 27/00
[52] U.S. Cl. ..................... 437/52; 437/48; 437/59
[58] Field of Search ............. 437/52, 48, 60, 59

[56] References Cited

U.S. PATENT DOCUMENTS

| | | | |
|---|---|---|---|
| 4,541,166 | 9/1985 | Yamazaki | 156/543 |
| 4,737,831 | 4/1988 | Iwai | 357/49 |
| 4,769,786 | 9/1988 | Garnache et al. | 365/182 |
| 4,849,369 | 7/1989 | Jeuch et al. | 437/50 |
| 4,937,641 | 6/1990 | Sunami et al. | 365/149 |
| 4,947,225 | 8/1990 | Custode | 357/49 |

FOREIGN PATENT DOCUMENTS

| | | | |
|---|---|---|---|
| 59-19366 | 1/1984 | Japan . | |
| 60-074638 | 4/1985 | Japan | 148/DIG. 116 |

Primary Examiner—Olik Chaudhuri
Assistant Examiner—H. Jey Tsai
Attorney, Agent, or Firm—Staas & Halsey

[57] ABSTRACT

A semiconductor device comprises: a semiconductor substrate, a semiconductor pillar projected from the semiconductor substrate, an insulating layer formed on the circumferential surface of the semiconductor pillar, a conductive side wall formed on the circumferential surface of the semiconductor pillar through the insulating layer, an insulating layer obtained by insulating a part of the conductive side wall in such a manner that the upper portion thereof are more insulated than other portion, an insulating layer formed on the substrate so that the surface of the insulating layer surrounds the conductive side wall and is continuously and flatly arranged at the head portion surface of the semiconductor pillar, and a conductive pattern an electrical contact with to the head portion surface of the semiconductor pillar electrically insulated from the conductive side wall.

4 Claims, 7 Drawing Sheets

Fig. 3D(1)
(PRIOR ART)
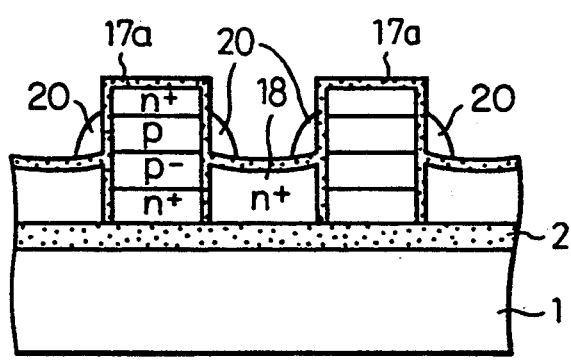
Fig. 3D(2)
(PRIOR ART)
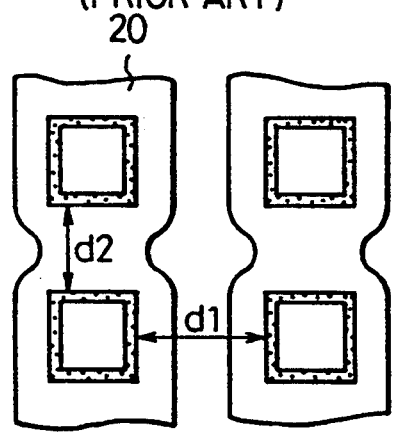
d2<d1
Fig. 3E
(PRIOR ART)
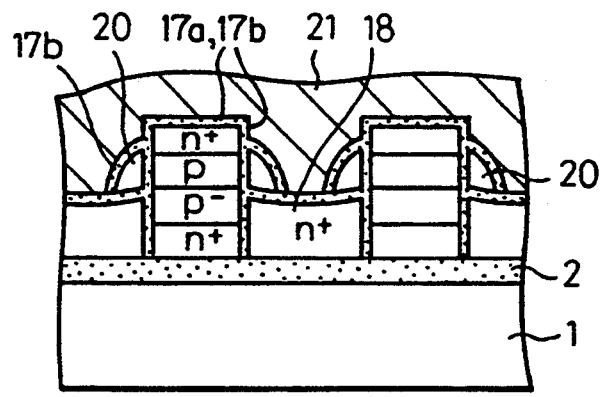

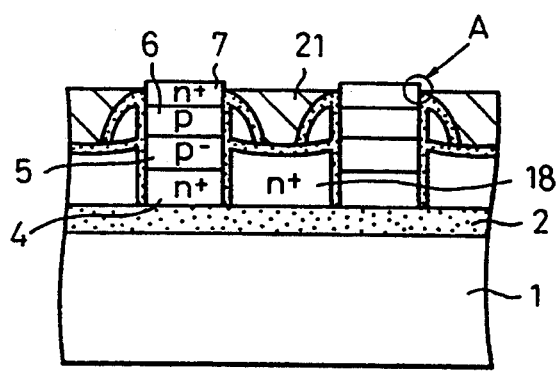
Fig. 3F
(PRIOR ART)
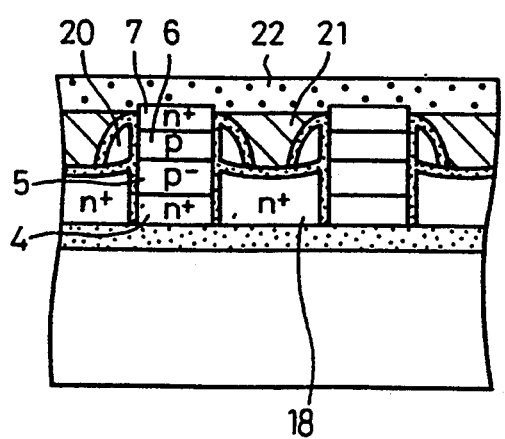
Fig. 3G(1)
(PRIOR ART)
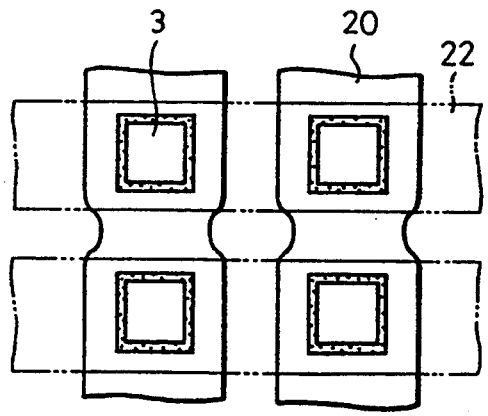
Fig. 3G(2)
(PRIOR ART)

METHOD OF PRODUCING PILLAR-SHAPED DRAM AND ROM DEVICES

This application is a continuation, of application Ser. No. 07/723,173, filed Jun. 28, 1991, now abandoned, which is a division of 07/357,809, filed on May 30, 1989, now U.S. Pat. No. 5,057,896, issued on Oct. 15, 1991.

BACKGROUND OF THE INVENTION

1. Field of the Invention

The present invention relates to a semiconductor device and a method of manufacturing same, and more particularly, to a semiconductor memory device wherein a head portion of a semiconductor pillar having a conductive side wall is brought into contact with a conductive pattern, and a method of manufacturing same.

2. Description of the Related Art

FIGS. 1 and 2, respectively, show cross-sectional views of a pillar-shaped DRAM (Dynamic Random Access Memory) and a ROM (Read Only Memory) of the prior art.

In FIG. 1 a $SiO_2$ film 2 is formed on a silicon substrate 1, and a semiconductor pillar 3 is formed on the $SiO_2$ film 2 and consists of a first conductive layer (storage electrode) 4, $p^-$ type Si layer 5, channel doped layer 6, and a second conductive layer (drain) 7. The DRAM of FIG. 1 further comprises a dielectric film 8, a gate insulating film ($SiO_2$) 9 a second conductive layer (electrode) 10, a polysilicon word line (gate) 11, an interlaminar insulating film 12 such as a PSG film, etc., and an aluminum bit line 13.

Further, as shown in FIG. 2, the ROM likewise comprises a pillar 3 formed on a silicon substrate 1 having a $n^+$ source region 19, a p channel region 6 and an $n^+$ drain region 7, dielectric film 2, a gate insulating film 9, a doped polysilicon gate electrode (word line), 11 a PSG interlaminar insulating film 12, and an aluminum bit line 13. The channel region 6 and the drain region 7 form a semiconductor pillar 3 on a portion of the source region 19.

To bring the semiconductor pillar 3 into contact with the bit line 13, a contact hole--13a as shown in FIGS. 1 and 2--; is formed in the interlaminar insulating film 12, by a photolithography process. In the process of forming the contact holes, 13a, the positioning of the second conductive layer 7 and the contact hole 13a (in FIG. 2) and of the drain region 7 and the contact hole 13a (in FIG. 2) is necessary at the exposure, and accordingly the whole head portion of the semiconductor pillar cannot be used for the contact, and thus the diameter of the semiconductor pillar must be enlarged.

FIGS. 3A to FIG. 3G show cross-sectional step views of the production of another DRAM cell according to the prior art.

First, as shown in FIG. 3A, a $SiO_2$ film 2 having a thickness of 0.5 μm, and $n^+$ conductive layer 4, a $p^-$ silicon layer 5 having a thickness of 5 μm, a p channel doped layer 6, and a $n^+$ conductive layer 7 are formed on a silicon substrate 1.

Then, as shown in FIG. 3B(1) a trench 15 is formed by etching the semiconductor layers (7, 6, 5 and 4) by an RIE process using an oxide film 14 as a mask. Each semiconductor pillar 3 obtained by the etching has a top surface cross section of 0.7 μm by 0.7 μm and the gap d1 between pillars in the X-direction is greater than that (d2) in the Y-direction, as shown in the top plan view of FIG. 3B(2). Then, as shown in FIG. 3C, after removing the mask 14 a $SiO_2$ film 17 and $n^+$ poly Si film 18 are formed thereafter the exposed $SiO_2$ film 17 is etched by hydrofluoric acid so that only--the non-exposed portion of the--; dielectric $SiO_2$ film 17 (i.e., the portion between the pillar 3 and the film 18)--; remains.

Then, as shown in FIG. 3D(1) the structure is thermally oxidized and a gate $SiO_2$ film 17a having a thickness of 200 Å is formed. Further, after forming a poly Si film by a CVD process on the exposed surface of the substrate, the poly Si film is etched back by an RIE process so that a side wall poly Si film 20, which becomes a gate electrode, remains; as explained above, different gaps are set up between the pillars, i.e., d1 is larger than d2 as shown in FIG. 3D(2).

Then, as shown in FIG. 3E, a $SiO_2$ film 17b is formed by thermal oxidation and a layer 21 of phospho-silicate-glass (PSG) or $SiO_2$ is deposited over the entire surface of the substrate by a CVD process.

Then, as shown in FIG. 3F, the deposited PSG or $SiO_2$ layer 21 is etched back until the top surface of the semiconductor pillar is exposed.

Then an aluminum film is deposited and patterned so that a bit line 22 is formed, and the bit line 22 and the $n^+$ conductive layer 7 in the semiconductor pillar are connected by a self alignment process. The above description is of a DRAM realized by a prior art, and in the etching back process shown in FIG. 3F the end point of the etching, wherein the semiconductor pillar is exposed, is not easily found, and therefore, since over-etching in often carried out, the $SiO_2$ film 17 at upper corner position A in FIG. 3F is also etched, whereby the desired thickness of the $SiO_2$ film can not be maintained and the breakdown voltage is lowered.

SUMMARY OF THE INVENTION

An object of the present invention is to provide a semiconductor device wherein a conductive pattern such as a bit line or like is brought into contact with a semiconductor pillar formed on a semiconductor substrate, by a self-alignment process, and a method of producing of the semiconductor device.

Another object of the present invention is to provide a semiconductor device, such as a DRAM cell structure wherein the semiconductor pillar formed on a semiconductor substrate has a smaller diameter, and a method of producing the semiconductor device.

Therefore, according to the present invention there is provided a semiconductor device which comprises a semiconductor substrate having a major surface a semiconductor pillar portion of the substrate projected upwardly from the semiconductor substrate--and having side walls and a top surface--, an insulating layer formed on the circumferential side wall surfaces of the semiconductor pillar, and the substrate, a conductive side wall formed on--portions of the insulating layer corresponding to and at the juncture of--; the circumferential surface of the semiconductor pillar --and the substrate, a second insulating layer formed on and covering the exposed surface of the conductive side wall,--; obtained by thermally oxidizing a part of the conductive side wall in such a manner that the upper portion--of the further insulating layer is thicker than the remaining, lower portion thereof,--, a third insulating layer formed on the substrate so that the surface of the third insulating layer surrounds the conductive side wall and is continuously and coplanar with the head a top surface portion surface of the semiconductor pillar, and a conductive pattern in electrical contact with the head or top surface of the semiconductor pillar and electrically insulated from the conductive side wall.

Further, there is provided a method of producing a semiconductor device, which comprises the steps of preparing semiconductor substrate, forming a semiconductor pillar projected from the semiconductor substrate, forming a first insulating layer on a head or top surface of the semiconductor pillar, forming a second insulating layer on the circumferential sidewall surface of the semiconductor pillar, forming a conductive side wall on the circumference of the semiconductor pillar, forming a third-insulating layer on the surface of the conductive side wall, forming a fourth insulating layer on the entire exposed surface of the device so that the semiconductor pillar and the conductive side wall are buried, removing the fourth insulating layer so as to form a coplanar surface thereof with the head surface of the semiconductor pillar--, --;

selectively--, further insulating the upper portion of the conductive side wall without further insulating the semiconductor pillar by using the first insulating layer as a mask, to improve the breakdown voltage between the conductive side wall and other elements, removing at least the part of the first insulating layer formed on the head surface of the semiconductor pillar, and forming a conductive pattern on the head surface of the semiconductor pillar in electrical contact therewith and on the fourth insulating layer.

BRIEF DESCRIPTION FOR THE DRAWINGS

FIGS. 1 and 2 are, respectively, cross-sectional views of a pillar shaped DRAM and a pillar shape ROM of the prior art;

FIGS. 3A, 3B1, 3B2, 3C, 3D1, 3D2, 3E, 3F and 3G1 to 3G2 are cross-sectional views of successive steps in the production of another DRAM cell according to the prior art;

DESCRIPTION OF THE PREFERRED EMBODIMENTS

An example of the present invention will now be explained with reference to FIGS. 4A to 4F.

FIGS. 4A to 4F show cross-sectional views of--an exemplary structure as produced at successive steps of the process--; according to the present invention.

Figure 4A:
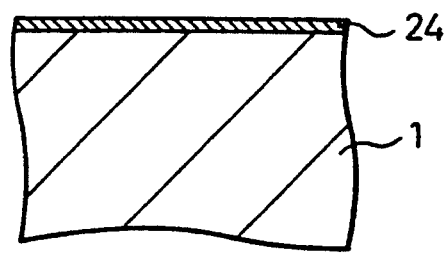
FIGS. 4A to 4F are cross sectional views of --an exemplary structure, as produced at successive steps of the process--; according to the present invention.

First, as shown in FIG. 4A a silicon nitride ($Si_3N_4$) film 24 having a thickness of about 0.15 μm is formed on a surface of a silicon substrate 1, by a usual CVD (chemical vapour deposition) process. The $Si_3N_4$ film 24 acts as an antioxidant film in an oxidizing process carried out at a later process step.

Figure 4B:
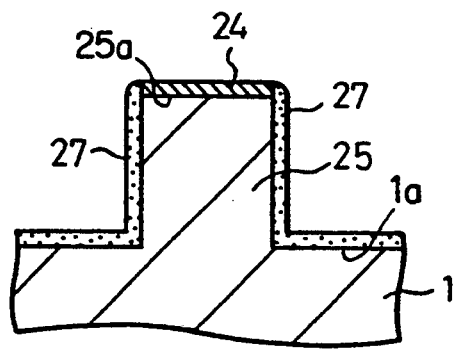

Then, the upper portion of the silicon substrate 1 is etched to form a projected pillar portion--;--; for example--,--, a resist pattern (not shown) is formed on a desired portion of the surface of the $Si_3N_4$ film 24, and using the resist pattern as a mask, the $Si_3N_4$ film 24 and the silicon substrate 1 respectively, are selectively etched. The--thickness of the resulting pillar 25 of the thus-shaped--silicon is--,--; for example, about 2.0 μm. After forming the pillar shaped silicon 25 with the $Si_3N_4$ film 24, --on the resulting, top flat (i.e., planar) surface 25a thereof--, and change "exposed surface" to--the exposed circumferential (i.e., vertical) side wall surfaces 25b--; exposed surface of the pillar shaped silicon 25 is oxidized to form an oxide film 27 having a thickness of about 300 Å, as shown in FIG. 4B.

Figure 4C:
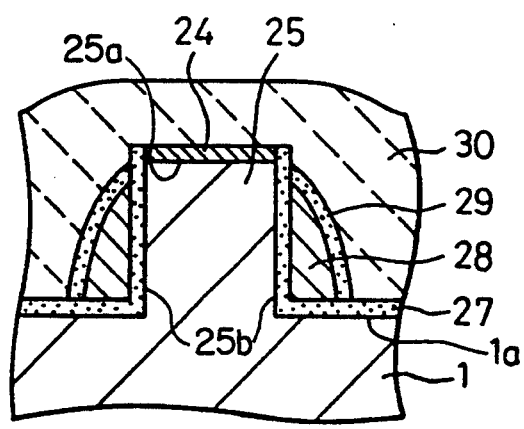

Then a conductive side wall 28 is formed on the oxide film 27 of the pillar shaped silicon 25. The conductive side wall 28 is formed by the steps of depositing a polysilicon layer on the entire exposed surface, implanting n type impurities (dopant) therein, and diffusing same, and carrying out an anisotropic etching process step using a reactive ion etching so that the polysilicon material remains on only a--portion of the (vertical) side wall surfaces 25b--; of the pillar shaped --silicon 25, extending over, and from, a portion of the upper surface 1a of the substrate (as covered by the insulating layer 27) and upwardly along the vertical side wall surfaces 25a to a position adjacent to, but below, the top surface 25b--; whereby the polysilicon side wall 28 is formed. Then the surface of the polysilicon side wall 28 is oxidized to form an oxide film 29, and subsequently, a PSG or $SiO_2$ layer 30 is formed on the entire exposed surface--,-- as an interlaminar insulating film and so that the semiconductor pillar 25 is buried as shown in FIG. 4C.

Figure 4D:
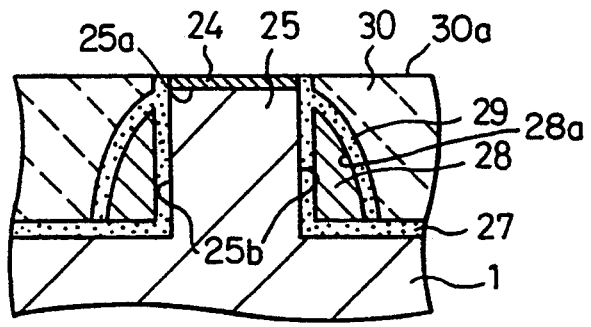

Then, as shown in FIG. 4D the PSG or $SiO_2$ layer 30 is etched back so that the surface of the $Si_3N_4$ film 24 is exposed, with the result that the top surfaces 25a and 30a of the pillar shaped silicon 25 and the interlaminar insulating film 30 respectively form a continuous flat surface.

If after removing the $Si_3N_4$ film 24--and corresponding, partial etching of the PSG film 30--; an aluminum wiring is formed on the resulting exposed top surface 25A of the silicon pillar 25, contact between the silicon pillar top surface 25a and the wiring can be realized by a self alignment process and without the need for mask alignment.

When the aluminum wiring is formed by such steps, however, a semiconductor element is apt to be broken due to a low breakdown voltage between the aluminum wiring and the polysilicon side wall 28. The low breakdown voltage exists because when the PSG film 30 is etched back a portion of the PSG film 30 adjacent the top portion 28a of the polysilicon side wall 28, and subsequently a part of the top portion 29a of the oxide film 29, are etched whereby an insulating film having a thickness sufficient to withstand the breakdown voltage is not left thereat.

Figure 4E:
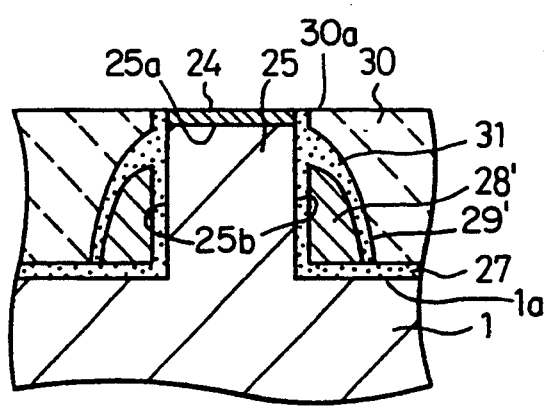

According to the present invention, after exposing the $Si_3N_4$ film 24, and to prevent the above-mentioned over etching, an oxidizing treatment is additionally carried out since, during this oxidizing treatment, the $Si_3N_4$ film 24 acts as an antioxidizing film, and thus the pillar shaped silicon 25 is not oxidized. Further, since---an oxidizing specie such as oxygen diffuses through--, after "29" insert --,--, and delete "has been"; the PSG film 30 and the oxide film 29 has been oxidized, the polysilicon side wall 28 is extending from the top portion 28a thereof downwardly, and thus the top portion 28a of the polysilicon side wall 28 is oxidized to a depth, e.g., about 0.2 μm, sufficient to withstand the breakdown voltage, and accordingly, --the oxide film 29' includes a thickened--; oxide portion 31 --at the top of the remaining polysilicon side wall 28', --; as shown in FIG. 4E.

Figure 4F:
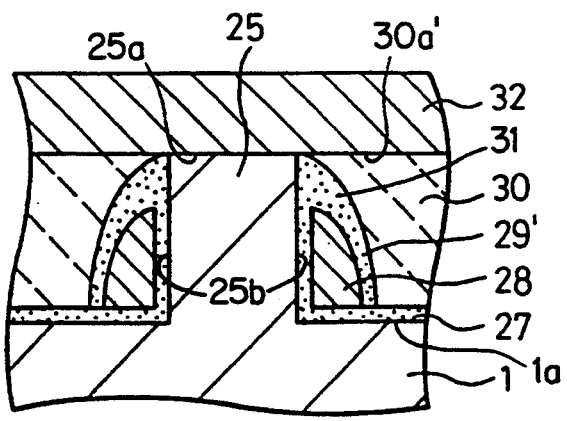

After removing the flat and exposed upper surface 25a of the Si3N4 film 24, an aluminum wiring or interconnection pattern 32 is formed on the pillar shaped silicon 25 and--the etched-back upper surface 30a' of--, and after "30" insert; --, --; the PSG film 30 as shown in FIG. 4F. This formation of the aluminum wiring pattern 32 does not require the formation of a contact hole in the PSG film 30, and as this technique does not require a mask alignment, the head, or top, surface 25a of the pillar shaped silicon 25 can be narrowed--relatively to the width required when a hole must be formed and--; whereby the aluminum wiring 32 can be formed by a self alignment process. Further, a sufficient breakdown voltage property between the aluminum wiring 22 and the polysilicon side wall 28 is provided by the above-explained oxidizing treatment--and particularly due to the resulting thickened oxide portion 31--;.

In this example--,--; impurity doped regions are usually and optionally formed in the silicon substrate 1 and the pillar shaped--silicon 25 (corresponding to pillar 3 i;n FIGS. 1 and 2, for example) during the process of the present invention--;--, further, although in this example the breakdown voltage property is enhanced by oxidizing the polysilicon, sidewall 28 it may be also enhanced by nitriding the polysilicon sidewall 28. In such a case, a film having an anti-nitriding property, such as an oxide film, must be formed on the top surface 25a of the pillar-shaped silicon 25.

Figure 1:
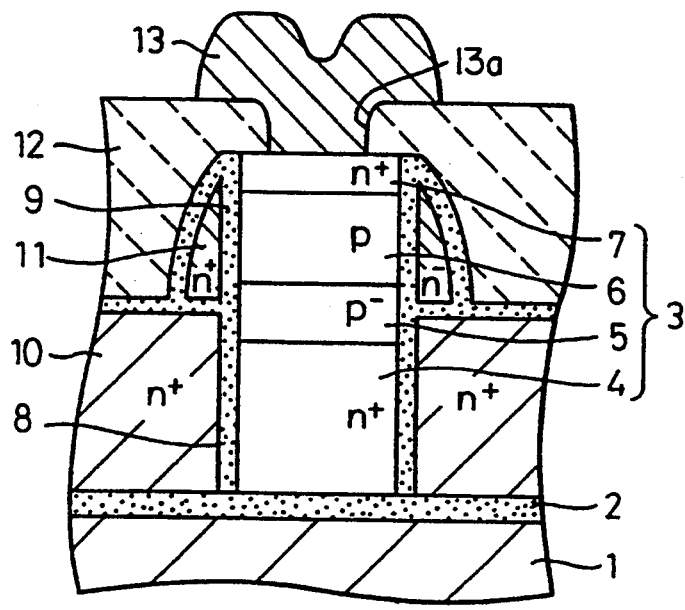
Figure 2:
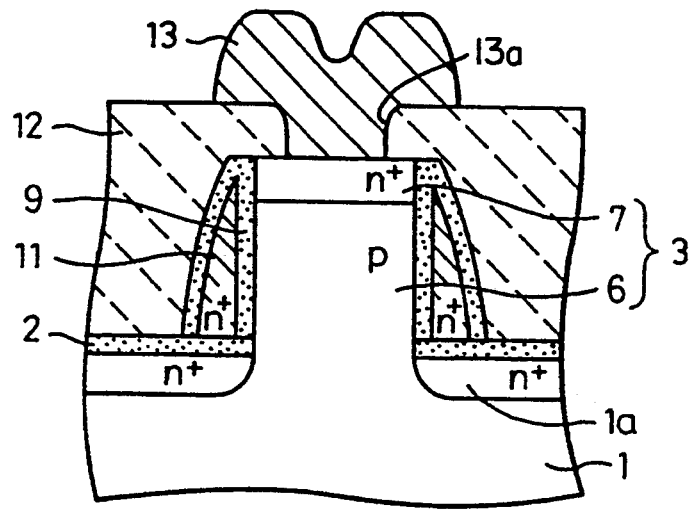
Figure 5:
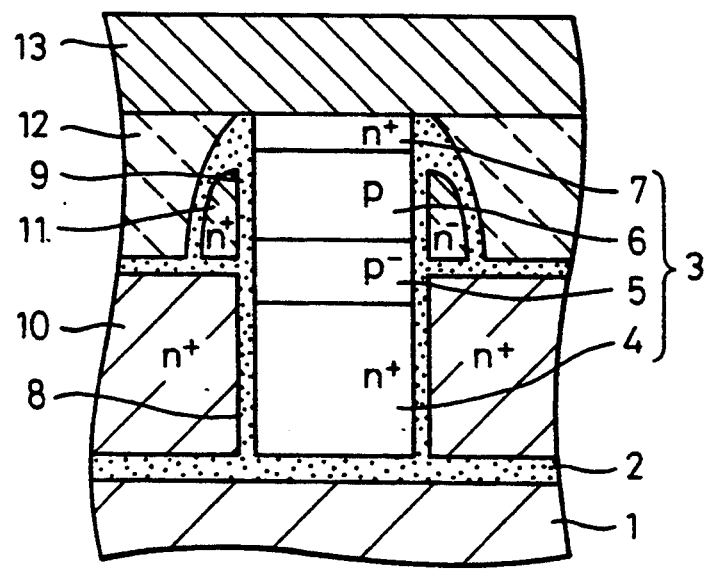
FIGS. 5 and 6 are cross-sectional views of a DRAM and a ROM respectively according to the present invention.
Figure 6:
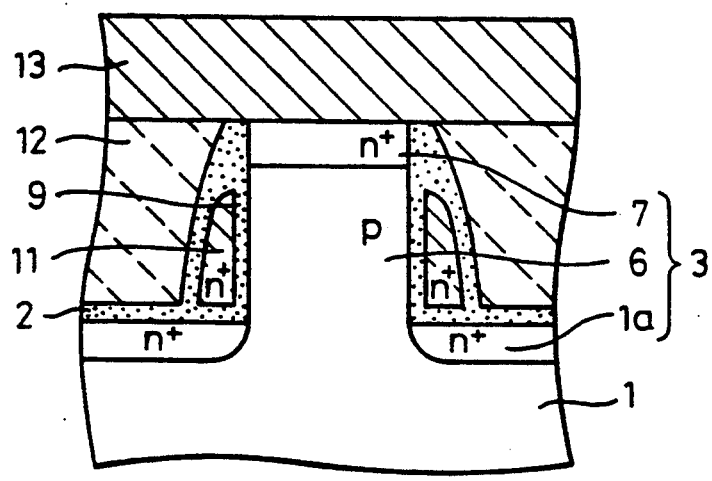

FIGS. 5 and 6 show cross sectional views of respective examples of a DRAM and a ROM according to the present invention. In these two examples, bit lines 13 are formed on a pillar shaped silicon 3 by a self-alignment process. Further, the upper portion of a gate insulating film (SiO2) 9 resulting from the additional oxidizing process--,-- is thick. The other structural elements are substantially the same as shown in FIGS. 1 and 2.

As explained above, according to the present invention, wiring can be easily brought into contact with a surface of a semiconductor pillar formed or a substrate, by a self alignment process, without positioning, with the result that a miniaturization of a device can be realized and the costs reduced.

I claim:
1. A method of producing a semiconductor device, which comprises the steps of:
   preparing a semiconductor substrate;
   forming a semiconductor pillar, projecting upwardly from a main surface of a semiconductor substrate by a first height and having a circumferential sidewall surface substantially perpendicular to, and a top surface at the first height which is substantially parallel to, the main surface of the semiconductor substrate;
   forming a first insulating layer on the top surface of the semiconductor pillar, the first insulating layer having an upper surface;
   forming a second insulating layer by an oxidation process on the circumferential sidewall surface of the semiconductor pillar and the main surface of the substrate;
   forming a conductive sidewall on the second insulating layer, surrounding the circumferential sidewall of the semiconductor pillar and spaced therefrom by the second insulating layer, the conductive sidewall having a top edge at a second height, less than the first height of the top surface of the semiconductor pillar;
   forming a third insulating layer on the surface of the conductive sidewall;
   forming a fourth insulating layer on the entire exposed surface of the device so as to cover the exposed main surface of the substrate and bury the semiconductor pillar, including the conductive sidewall formed thereon and the top surface thereof;
   removing a portion of the fourth insulating layer so as to form an upper surface thereof which is substantially parallel to the main surface of the substrate and substantially coplanar with the upper surface of the first insulating layer formed on the top surface of the semiconductor pillar;
   selectively and without oxidizing the semiconductor pillar, oxidizing an upper portion of the conductive sidewall, including and extending from the top edge thereof, thereby to form an additional insulating portion integral with the third insulating layer formed on the surface of the conductive sidewall and with the second insulating layer formed on the circumferential sidewall surface of the semiconductor pillar, the additional insulating portion affording an improved breakdown voltage characteristic of the conductive sidewall relative to the upper surface of the fourth insulating layer;
   removing at least a part of the first insulating layer formed on the top surface of the semiconductor pillar thereby to expose at least a corresponding part of the top surface of the semiconductor pillar; and
   forming a conductive pattern on and in electrical contact with the at least a part of and exposed top surface of the semiconductor pillar and extending on the upper surface of the fourth insulating layer.
2. A method according to claim 1, wherein said substrate is a silicon substrate.
3. A method according to claim 1, wherein said semiconductor pillar is a silicon pillar.
4. A method according to claim 1, wherein said first insulating layer is a silicon nitride layer and said additional insulating portion obtained by selectively oxidizing the upper portion of the conductive side wall is silicon oxide.

* * * * *

UNITED STATES PATENT AND TRADEMARK OFFICE
CERTIFICATE OF CORRECTION

PATENT : 5,372,964

DATED : Dec. 13, 1994

INVENTOR(S) : Hiroshi Gotou

It is certified that error appears in the above-identified patent and that said Letters Patent is hereby corrected as shown below:

Delete columns 1-6, and substitute therefor columns 1-6, as shown on the attached pages.

Signed and Sealed this

Sixth Day of January, 1998

*Attest:*

BRUCE LEHMAN

*Attesting Officer*    *Commissioner of Patents and Trademarks*

METHOD OF PRODUCING PILLAR-SHAPED DRAM AND ROM DEVICES

This application is a continuation of application Ser. No. 07/723,173, filed Jun. 28, 1991, now abandoned, which is a division of 07/357,809, filed on May 30, 1989, now U.S. Pat. No. 5,057,896, issued on Oct. 15, 1991.

BACKGROUND OF THE INVENTION

1. Field of the Invention

The present invention relates to a semiconductor device and a method of manufacturing same, and more particularly, to a semiconductor memory device wherein a head portion of a semiconductor pillar having a conductive side wall is brought into contact with a conductive pattern, and a method of manufacturing same.

2. Description of the Related Art

FIGS. 1 and 2, respectively, show cross-sectional views of a pillar-shaped DRAM (Dynamic Random Access Memory) and a ROM (Read Only Memory) of the prior art.

In FIG. 1 a $SiO_2$ film 2 is formed on a silicon substrate 1, and a semiconductor pillar 3 is formed on the $SiO_2$ film 2 and consists of a first conductive layer (storage electrode) 4, $p^-$ type Si layer 5, channel doped layer 6, and a second conductive layer (drain) 7. The DRAM of FIG. 1 further comprises a dielectric film 8, a gate insulating film ($SiO_2$) 9 a second conductive layer (electrode) 10, a polysilicon word line (gate) 11, an interlaminar insulating film 12 such as a PSG film, etc., and an aluminum bit line 13.

Further, as shown in FIG. 2, the ROM likewise comprises a pillar 3 formed on a silicon substrate 1 having a $n^+$ source region 19, a p channel region 6 and an $n^+$ drain region 7, dielectric film 2, a gate insulating film 9, a doped polysilicon gate electrode (word line) 11, a PSG interlaminar insulating film 12, and an aluminum bit line 13. The channel region 6 and the drain region 7 form a semiconductor pillar 3 on a portion of the source region 19.

To bring the semiconductor pillar 3 into contact with the bit line 13, a contact hole 13a as shown in FIGS. 1 and 2 is formed in the interlaminar insulating film 12, by a photolithography process. In the process of forming the contact holes 13a, the positioning of the second conductive layer 7 and the contact hole 13a (in FIG. 1) and of the drain region 7 and the contact hole 13a (in FIG. 2) is necessary at the exposure, and accordingly the whole head portion of the semiconductor pillar cannot be used for the contact, and thus the diameter of the semiconductor pillar must be enlarged.

FIG. 3A to FIG. 3G show cross-sectional step views of the production of another DRAM cell according to the prior art.

Figure 3A:
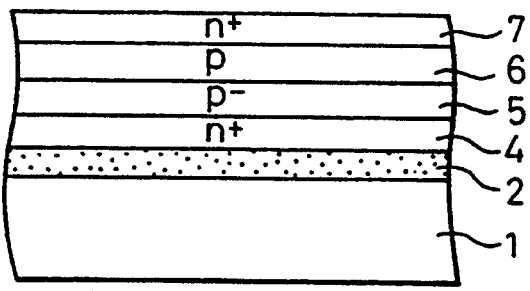
Figure 3A:
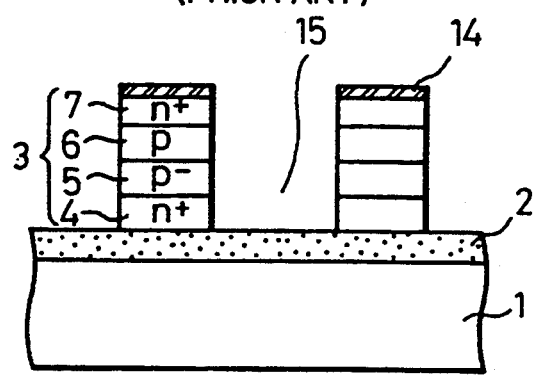
Figure 3A:
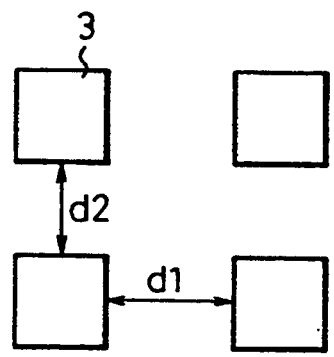

First, as shown in FIG. 3A, a $SiO_2$ film 2 having a thickness of 0.5 μm, an $n^+$ conductive layer 4, a $p^-$ silicon layer 5 having a thickness of 5 μm, a p channel doped layer 6, and a $n^+$ conductive layer 7 are formed on a silicon substrate 1.

Figure 3C:
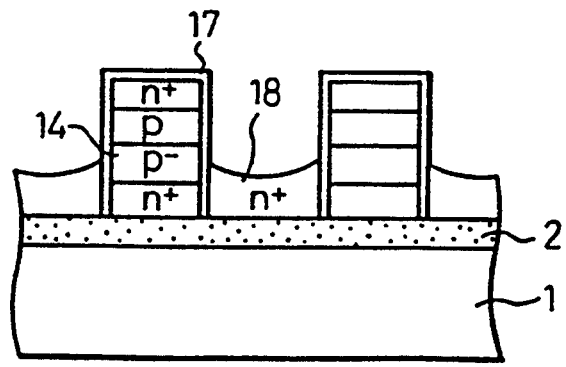

Then, as shown in FIG. 3B(1) a trench 15 is formed by etching the semiconductor layers (7, 6, 5 and 4) by an RIE process using an oxide film 14 as a mask. Each semiconductor pillar 3 obtained by the etching has a top surface cross section of 0.7 μm by 0.7 μm and the gap d1 between pillars in the X-direction is greater than that (d2) in the Y-direction, as shown in the top plan view of FIG. 3B(2). Then, as shown in FIG. 3C, after removing the mask 14 a $SiO_2$ film 17 and $n^+$ poly Si film 18 are formed; thereafter, the exposed $SiO_2$ film 17 is etched by hydrofluoric acid so that only the non-exposed portion of the dielectric $SiO_2$ film 17 (i.e., the portion between the pillar 3 and the film 18) remains.

Then, as shown in FIG. 3D(1) the structure is thermally oxidized and a gate $SiO_2$ film 17a having a thickness of 200 Å is formed. Further, after forming a poly Si film by a CVD process on the exposed surface of the substrate, the poly Si film is etched back by an RIE process so that a side wall poly Si film 20, which becomes a gate electrode, remains; as explained above, different gaps are set up between the pillars, i.e., d1 is larger than d2 as shown in FIG. 3D(2).

Then, as shown in FIG. 3E, a $SiO_2$ film 17b is formed by thermal oxidation and a layer 21 of phospho-silicate-glass (PSG) or $SiO_2$ is deposited over the entire surface of the substrate by a CVD process.

Then, as show in FIG. 3F, the deposited PSG or $SiO_2$ layer 21 is etched back until the top surface of the semiconductor pillar is exposed.

Then an aluminum film is deposited and patterned so that a bit line 22 is formed, and the bit line 22 and the $n^+$ conductive layer 7 in the semiconductor pillar are connected by a self alignment process. The above description is of a DRAM realized by a prior art, and in the etching back process shown in FIG. 3F the end point of the etching, wherein the semiconductor pillar is exposed, is not easily found, and therefore, since overetching is often carried out, the $SiO_2$ film 17 at the upper, corner position A in FIG. 3F is also etched, whereby the desired thickness of the $SiO_2$ film can not be maintained and the breakdown voltage is lowered.

SUMMARY OF THE INVENTION

An object of the present invention is to provide a semiconductor device wherein a conductive pattern such as a bit line or like is brought into contact with a semiconductor pillar formed on a semiconductor substrate, by a self-alignment process, and a method of producing the semiconductor device.

Another object of the present invention is to provide a semiconductor device, such as a DRAM cell structure wherein the semiconductor pillar formed on a semiconductor substrate has a smaller diameter, and a method of producing the semiconductor device.

Therefore, according to the present invention there is provided a semiconductor device which comprises a semiconductor substrate having a major surface, a semiconductor pillar portion of the substrate projected upwardly from the semiconductor substrate and having side walls and a top surface, an insulating layer formed on the circumferential side wall surfaces of the semiconductor pillar and the substrate, a conductive side wall formed on portions of the insulating layer corresponding to and at the juncture of the circumferential surface of the semiconductor pillar and the substrate, a second insulating layer formed on and covering the exposed surface of the conductive side wall, obtained by thermally oxidizing a part of the conductive side wall in such a manner that the upper portion of the further insulating layer is thicker than the remaining, lower portion thereof, a third insulating layer formed on the substrate so that the surface of the third insulating layer surrounds the conductive side wall and is continuously and coplanar with the head a top surface portion surface of the semiconductor pillar, and a conductive pattern in electrical contact with the head, or top surface of the semiconductor pillar and electrically insulated from the conductive side wall.

Further, there is provided a method of producing a semiconductor device, which comprises the steps of preparing semiconductor substrate, forming a semiconductor pillar projected from the semiconductor substrate, forming a first insulating layer on a head or top surface of the semiconductor pillar, forming a second insulating layer on the circumferential side wall surface of the semiconductor pillar, forming a conductive side wall on the circumference of the semiconductor pillar, forming a third-insulating layer on the surface of the conductive side wall, forming a fourth insulating layer on the entire exposed surface of the device so that the semiconductor pillar and the conductive side wall are buried, removing the fourth insulating layer so as to form a coplanar surface thereof with the head surface of the semiconductor pillar, selectively, further insulating the upper portion of the conductive side wall without further insulating the semiconductor pillar by using the first insulating layer as a mask, to improve the breakdown voltage between the conductive side wall and other elements, removing at least the part of the first insulating layer formed on the head surface of the semiconductor pillar, and forming a conductive pattern on the head surface of the semiconductor pillar in electrical contact therewith, and the fourth insulating layer.

BRIEF DESCRIPTION FOR THE DRAWINGS

FIGS. 1 and 2 are, respectively, cross-sectional views of a pillar shaped DRAM and a pillar shaped ROM of the prior art;

FIGS. 3A, 3B1, 3B2, 3C, 3D1, 3D2, 3E, 3F and 3G1 to 3G2 are cross-sectional views of successive steps in the production of another DRAM cell according to the prior art;

FIGS. 4A to 4F are cross sectional views of an exemplary structure, as produced at successive steps of the process according to the present invention;

FIGS. 5 and 6 are cross-sectional views of a DRAM and a ROM respectively, according to the present invention.

DESCRIPTION OF THE PREFERRED EMBODIMENTS

An example of the present invention will now be explained with reference to FIGS. 4A to 4F.

FIGS. 4A to 4F show cross-sectional views of an exemplary structure as produced at successive steps of the process according to the present invention.

First, as shown in FIG. 4A, a silicon nitride ($Si_3N_4$) film 24 having a thickness of about 0.15 μm is formed on a surface of a silicon substrate 1, by a usual CVD (chemical vapour deposition) process. The $Si_3N_4$ film 24 acts as an antioxidant film in an oxidizing process carried out at a later process step.

Then, the upper portion of the silicon substrate 1 is etched to form a projected pillar portion; for example, a resist pattern (not shown) is formed on a desired portion of the surface of the $Si_3N_4$ film 24, and using the resist pattern as a mask, the $Si_3N_4$ film 24 and the silicon substrate 1 respectively, are selectively etched. The thickness of the resulting pillar 25 of the thus-shaped silicon is, for example, about 2.0 μm. After forming the pillar shaped silicon 25 with the $Si_3N_4$ film 24 on the resulting, top flat (i.e., planar) surface 25a thereof, the exposed circumferential (i.e., vertical) side wall surfaces 25b of the pillar shaped silicon 25 is oxidized to form an oxide film 27 having a thickness of about 300 Å, as shown in FIG. 4B.

Then a conductive side wall 28 is formed on the oxide film 27 of the pillar shaped silicon 25. The conductive side wall 28 is formed by the steps of depositing a polysilicon layer on the entire exposed surface, implanting n type impurities (dopant) therein, and diffusing same, and carrying out an anisotropic etching process step using a reactive ion etching so that the polysilicon material remains on only a portion of the (vertical) side wall surfaces 25b of the pillar shaped silicon 25, extending over, and from, a portion of the upper surface 1a of the substrate (as covered by the insulating layer 27) and upwardly along the vertical side wall surfaces 25a to a position adjacent to, but below, the top surface 25b whereby the polysilicon side wall 28 is formed. Then the surface of the polysilicon side wall 28 is oxidized to form an oxide film 29, and subsequently, a PSG or $SiO_2$ layer 30 is formed on the entire exposed surface, as an interlaminar insulating film so that the semiconductor pillar 25 is buried as shown in FIG. 4C.

Then, as shown in FIG. 4D the PSG or $SiO_2$ layer 30 is etched back so that the surface of the $Si_3N_4$ film 24 is exposed, with the result that the top surfaces 25a and 30a of the pillar shaped silicon 25 and the interlaminar insulating film 30, respectively, form a continuous flat surface.

If after removing the $Si_3N_4$ film 24 and corresponding, partial etching of the PSG film 30 an aluminum wiring is formed on the resulting, exposed top surface 25a of the silicon pillar 25, contact between the silicon pillar top surface 25a and the wiring can be realized by a self alignment process and without the need for mask alignment.

When the aluminum wiring is formed by such steps, however, a semiconductor element is apt to be broken due to a low breakdown voltage between the aluminum wiring and the polysilicon side wall 28. The low breakdown voltage exists because when the PSG film 30 is etched back, a portion of the PSG film 30 adjacent the top portion 28a of the polysilicon side wall 28, and subsequently a part of the top portion 29a of the oxide film 29, are etched whereby an insulating film having a thickness sufficient to withstand the breakdown voltage is not left thereat.

According to the present invention, after exposing the $Si_3N_4$ film 24, and to prevent the above-mentioned over etching, an oxidizing treatment is additionally carried out since, during this oxidizing treatment, the $Si_3N_4$ film 24 acts as an antioxidizing film, and thus the pillar shaped silicon 25 is not oxidized. Further, since an oxidizing specie such as oxygen diffuses through the PSG film 30 and the oxide film 29, oxidized, the polysilicon side wall 28 is extending from the top portion 28a thereof downwardly, and thus the top portion 28a of the polysilicon side wall 28 is oxidized to a depth, e.g., about 0.2 μm, sufficient to withstand the breakdown voltage, and accordingly, the oxide film 29' includes a thickened oxide portion 31 at the top of the remaining polysilicon side wall 28', as shown in FIG. 4E.

After removing the $Si_3N_4$ film 24, an aluminum wiring or interconnection pattern 32 is formed on the common, flat and exposed upper surface 25a of the pillar shaped silicon 25 and the etched-back upper surface 30a' of the PSG film 30 as shown in FIG. 4F. This formation of the aluminum wiring pattern 32 does not require the formation of a contact hole in the PSG film 30, and as this technique does not require a mask alignment, the head, or top, surface 25a of the pillar shaped silicon 25 can be narrowed, relatively to the width required when a hole must be formed and whereby the aluminum wiring 32 can be formed by a self alignment process. Further, a sufficient breakdown voltage property between the aluminum wiring 22 and the polysilicon side wall 28 is provided by the above-explained oxidizing treatment and particularly due to the resulting thickened oxide portion 31.

In this example, impurity doped regions are usually and optionally formed in the silicon substrate 1 and the pillar shaped silicon 25 (corresponding to pillar 3 in FIGS. 1 and 2, for example) during the process of the present invention; further, although in this example the breakdown voltage property is enhanced by oxidizing the polysilicon, side wall 28 it may be also enhanced by nitriding the polysilicon side wall 28. In such a case, a film having an anti-nitriding property, such as an oxide film, must be formed on the top surface 25a of the pillar-shaped silicon 25.

FIGS. 5 and 6 show cross sectional views of respective examples of a DRAM and a ROM according to the present invention. In these two examples, bit lines 13 are formed on a pillar shaped silicon 3 by a self-alignment process. Further, the upper portion of a gate insulating film (SiO$_2$) 9, resulting from the additional oxidizing process, is thick. The other structural elements are substantially the same as shown in FIGS. 1 and 2.

As explained above, according to the present invention, wiring can be easily brought into contact with a surface of a semiconductor pillar formed or a substrate, by a self alignment process, without positioning, with the result that a miniaturization of a device can be realized and the costs reduced.

I claim:

1. A method of producing a semiconductor device, which comprises the steps of:

preparing a semiconductor substrate;

forming a semiconductor pillar, projecting upwardly from a main surface of a semiconductor substrate by a first height and having a circumferential sidewall surface substantially perpendicular to, and a top surface at the first height which is substantially parallel to, the main surface of the semiconductor substrate;

forming a first insulating layer on the top surface of the semiconductor pillar, the first insulating layer having an upper surface;

forming a second insulating layer by an oxidation process on the circumferential sidewall surface of the semiconductor pillar and the main surface of the substrate;

forming a conductive sidewall on the second insulating layer, surrounding the circumferential sidewall of the semiconductor pillar and spaded therefrom by the second insulating layer, the conductive sidewall having a top edge at a second height, less than the first height of the top surface of the semiconductor pillar;

forming a third insulating layer on the surface of the conductive sidewall;

forming a fourth insulating layer on the entire exposed surface of the device so as to cover the exposed main surface of the substrate and bury the semiconductor pillar, including the conductive sidewall formed thereon and the top surface thereof;

removing a portion of the fourth insulating layer so as to form an upper surface thereof which is substantially parallel to the main surface of the substrate and substantially coplanar with the upper surface of the first insulating layer formed on the top surface of the semiconductor pillar;

selectively and without oxidizing the semiconductor pillar, oxidizing an upper portion of the conductive sidewall, including and extending from the top edge thereof, thereby to form an additional insulating portion integral with the third insulating layer formed on the surface of the conductive sidewall and with the second insulating layer formed on the circumferential sidewall surface of the semiconductor pillar, the additional insulating portion affording an improved breakdown voltage characteristic of the conductive sidewall relative to the upper surface of the fourth insulating layer;

removing at least a part of the first insulating layer formed on the top surface of the semiconductor pillar thereby to expose at least a corresponding part of the top surface of the semiconductor pillar; and forming a conductive pattern on and in electrical contact with the at least a part of and exposed top surface of the semiconductor pillar and extending on the upper surface of the fourth insulating layer.

2. A method according to claim 1, wherein said substrate is a silicon substrate.

3. A method according to claim 1, wherein said semiconductor pillar is a silicon pillar.

4. A method according to claim 1, wherein said first insulating layer is a silicon nitride layer and said additional insulating portion obtained by selectively oxidizing the upper portion of the conductive side wall is silicon oxide.

* * * * *

UNITED STATES PATENT AND TRADEMARK OFFICE
CERTIFICATE OF CORRECTION

PATENT NO. : 5,372,964
DATED : Dec. 13, 1994
INVENTOR(S) : Hiroshi GOTOU

It is certified that error appears in the above-identified patent and that said Letters Patent is hereby corrected as shown below:

Please make the following corrections to the Certificate of Correction which was signed and sealed on the Sixth Day of January, 1998:

Col. 2, line 58, change "head a" to --head, or--;
line 60, delete "portion surface".

Col. 3, line 29, change "3B1, 3B2" to --3B(1), 3B(2)--; change "3D1, 3D2" to --3D(1), 3D(2)--; and change "3G1" to --3G(1)--;
line 30, change "3G2" to --3G(2)--.

Col. 4, line 45, delete "oxidized," and after "28 is" insert --oxidized,--.

Col. 5, line 44 (Claim 1, line 18), change "spaded" to --spaced--.

Signed and Sealed this

Sixth Day of October, 1998

*Attest:*

BRUCE LEHMAN

*Attesting Officer*    Commissioner of Patents and Trademarks